(12) United States Patent
Leeser

(10) Patent No.: US 6,307,728 B1
(45) Date of Patent: Oct. 23, 2001

(54) METHOD AND APPARATUS FOR DECHUCKING A WORKPIECE FROM AN ELECTROSTATIC CHUCK

(75) Inventor: Karl F. Leeser, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/489,458

(22) Filed: Jan. 21, 2000

(51) Int. Cl.[7] .................................................. H02N 13/00
(52) U.S. Cl. ............................................................ 361/234
(58) Field of Search ..................................... 361/230, 233, 361/234, 235; 279/128

(56) References Cited

U.S. PATENT DOCUMENTS

| | | | |
|---|---|---|---|
| 5,103,367 | * | 4/1992 | Horwitz et al. ........................ 361/234 |
| 5,436,790 | * | 7/1995 | Blake et al. ........................... 361/234 |
| 5,444,597 | * | 8/1995 | Blake et al. ........................... 361/234 |
| 5,818,682 | * | 9/1998 | Loo ....................................... 361/234 |

FOREIGN PATENT DOCUMENTS

| | | | |
|---|---|---|---|
| 0 615 281 A1 | 9/1994 | (EP) | ............................. H01L/21/00 |
| 0 822 590 A2 | 2/1998 | (EP) | ............................. H01L/21/68 |
| 88/09054 | 11/1988 | (WO) | ............................ H01L/21/68 |

* cited by examiner

*Primary Examiner*—Peter S. Wong
*Assistant Examiner*—Pia Tibbits
(74) *Attorney, Agent, or Firm*—Thomason, Moser & Patterson, LLP

(57) ABSTRACT

A method and apparatus that provides a dechucking voltage applied to an electrostatic chuck that facilitates removal of a workpiece or workpiece therefrom. The method incorporates residual chucking force information obtained from the preceding dechuck operation to modify and improve the dechucking algorithm for the subsequent wafer dechucking cycle. To avoid charge accumulation on the electrostatic chuck when processing a succession of workpieces, the chucking and dechucking voltages reverse polarity after each workpiece is dechucked.

26 Claims, 3 Drawing Sheets

METHOD AND APPARATUS FOR DECHUCKING A WORKPIECE FROM AN ELECTROSTATIC CHUCK

BACKGROUND OF THE DISCLOSURE

1. Field of the Invention

The invention relates to electrostatic chucks for holding a workpiece and, more specifically, to a method and apparatus for dechucking a workpiece from an electrostatic chuck.

2. Background of the Invention

Electrostatic chucks are used for holding a workpiece in various applications ranging from holding a sheet of paper in a computer graphics plotter to holding a semiconductor wafer within a semiconductor fabrication process system. Although electrostatic chucks vary in design, they all are based on the principle of applying a voltage to one or more electrodes in the chuck so as to induce opposite polarity charges in the workpiece and electrode(s), respectively. The electrostatic force between the opposite charges pulls the workpiece against the chuck, thereby retaining the workpiece.

A typical problem with electrostatic chucks is the difficulty of removing the electric charge from the workpiece and the chuck when it is desired to release the workpiece from the chuck. One conventional solution is to connect both the electrode and the workpiece to ground to drain the charge. Another conventional solution, which purportedly removes the charge more quickly, is to reverse the polarity of DC voltage applied to the electrodes. This technique is described in the context of a chuck having two electrodes (a bipolar chuck) in U.S. Pat. No. 5,117,121 issued May 26, 1992 to Watanabe, et al.

A shortcoming that has been observed with these conventional approaches to removing the electric charge is that they fail to completely remove the charge, so that some electrostatic force remains between the workpiece and the chuck. This residual electrostatic force typically necessitates the use of a mechanical force to separate the workpiece from the chuck. When the workpiece is a semiconductor wafer, the force required for removal sometimes cracks or otherwise damages the wafer. Even when the wafer is not damaged, the difficulty of mechanically overcoming the residual electrostatic force sometimes causes the wafer to pop off the chuck into an unpredictably position from which it is difficult to retrieve by a conventional wafer transport robot.

To more accurately reduce the residual electrostatic attractive force that remains between the workpiece and the chuck, attempts have been made to optimize the dechucking voltage by performing measurements upon the chucked wafer to determine an optimal dechucking voltage and dechucking period. Examples of dechucking arrangements are disclosed in commonly assigned U.S. Pat. No. 5,459,632, issued Oct. 17, 1995, to Birang, et al., and commonly assigned U.S. Pat. No. 5,818,682, issued Oct. 6, 1998, to Loo.

However, when successively processing a plurality of workpieces, these chucking/dechucking methods have not completely eliminated or compensated for chuck dielectric polarization and an incrementally increasing accumulation of residual charge on the chuck surface. The result of such charge accumulation is a progressive increase in the difficulty of dechucking each successive workpiece.

Therefore, there is a need in the art for a method that applies a dechucking signal that compensates for progressive charge accumulation upon the chuck surface when successively processing a plurality of workpieces.

SUMMARY OF THE INVENTION

The disadvantages heretofore associated with the prior art are overcome by the present invention of a method and apparatus that determines a dechucking signal applied to an electrostatic chuck to facilitate dechucking of a workpiece therefrom. Specifically, the method comprises the steps of determining a first dechucking signal based on a stored first residual attraction force metric; applying the dechucking signal to the electrostatic chuck; and, removing a first of the workpieces while measuring a second residual attraction force metric.

This method of dechucking the workpiece is accomplished after each workpiece is processed such that a residual charge does not accumulate upon the electrostatic chuck from workpiece to workpiece. Optionally, the polarity of the chucking and dechucking signals are reversed after each workpiece is dechucked to minimize charge accumulation.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
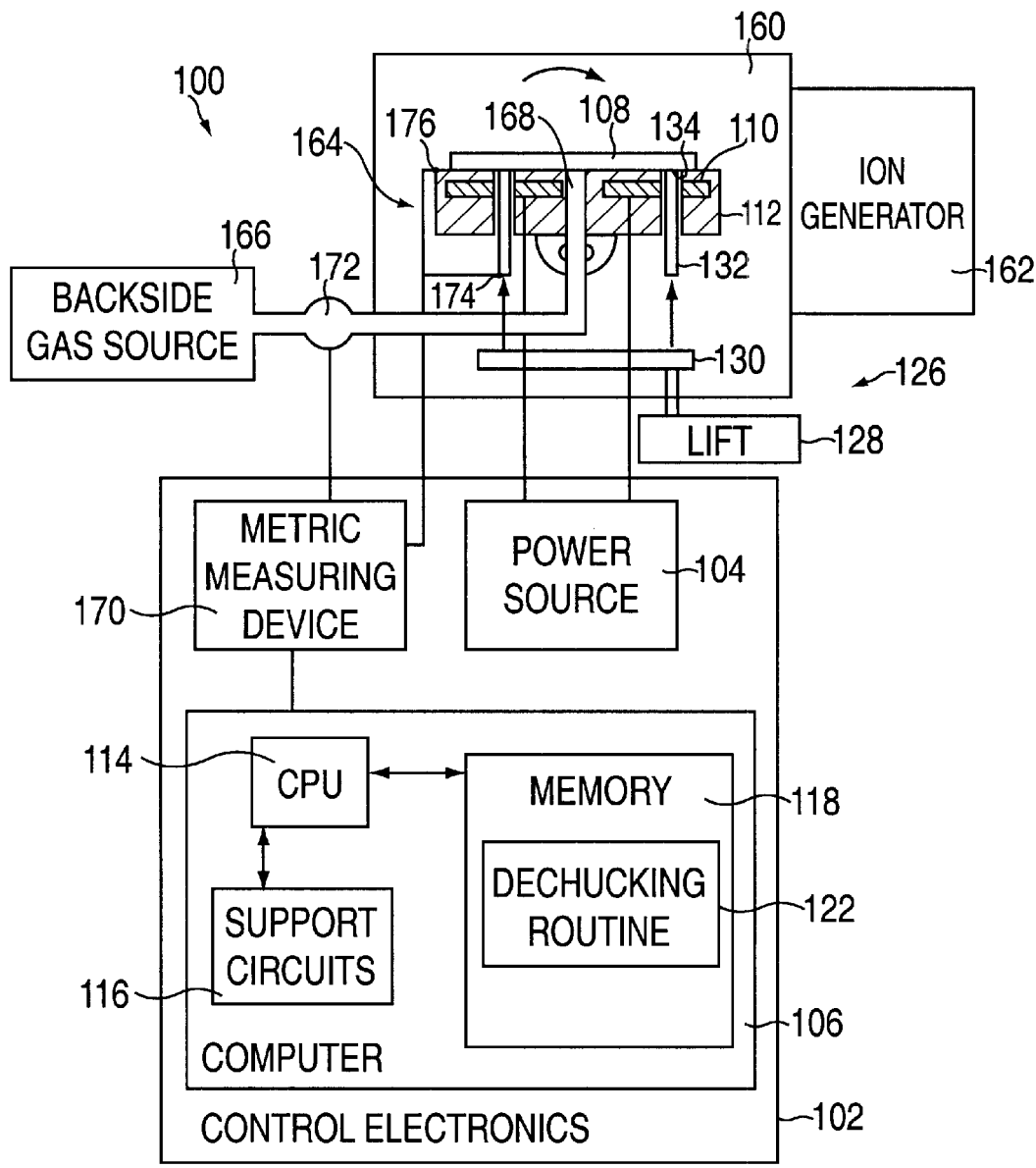
FIG. 1 is a sectional view, partially in schematic form, of a semiconductor wafer process system having an electrostatic chuck for retaining a semiconductor wafer during processing therein.

FIG. 1 is a schematic illustration of a cross-sectional view of a semiconductor wafer processing system 100, for example, an ion implant system. The system 160 comprises a vacuum chamber 160, an ion generator 162, an electrostatic chuck 164, a backside gas source 166, a lift system 126 and control electronics 102. The invention effectively provides a rapid, i.e., less than 200 msec, dechucking of a workpiece, e.g., a semiconductor wafer 108, from the electrostatic chuck 164. Although the invention is described in an exemplary ion implant system, the invention is also generally applicable to other semiconductor wafer processing systems wherever an electrostatic chuck is used to retain a wafer within a processing chamber.

The electrostatic chuck 164 is disposed in the chamber 160. The electrostatic chuck 164 has a pair of coplanar electrodes 110 embedded within a dielectric 112 that forms a support surface 134 upon which the electrostatic chuck 164 retains the wafer 108. The dielectric 112 typically is fabricated of cylindrical puck of ceramic material such as aluminum nitride, boron-nitride, alumina doped with a titanium oxide or a chromium oxide, or other dielectric material. The dielectric 112 includes a passage 168 that permits a heat transfer gas or gases, such as helium, to be supplied from the backside gas source 166 to an interstitial space between the support surface 134 and the wafer 108 to promote heat transfer. The electrostatic chuck 164 additionally comprises a plurality of lift pins 132 that pass through the dielectric 112 and selectively contact the wafer 108. The electrodes 110 typically are a plate or layer of a conductive material such as molybdenum. Although the exemplary electrostatic chuck 164 is depicted in bipolar form, those skilled in the art will realize from the following discussion that the present invention may be used with any type of electrostatic chuck, including monopolar chucks, dielectric chucks, ceramic chucks, and the like.

The lift system 126 generally comprises a lift actuator 128 coupled to a contact pad 130. To lift the wafer 108 from the support surface 134, the lift actuator 128 elevates the contact pad 130 to move the lift pins 132 against the wafer 108, raising the wafer 108 above the support surface 134.

The control circuitry 102 comprises a DC power supply 104 that is controlled by a computer 106. The DC power supply produces a variable positive and a variable negative voltage for each electrode of the bipolar chuck. In general, the computer 106 sets the output voltage value of the DC power supply 104. The control circuitry 102 additionally comprises a metric measuring device 170. The metric measuring device 170 is coupled to a sensor 172 that monitors flow conditions of the gas supplied by the backside gas source 166 to the support surface 134. The metric measuring device 170 provides a signal to the computer 106 representative of a residual force metric as further discussed below. Alternatively, a sensor 174 or a sensor 176 may be coupled to the metric measuring device 170. The sensor 174 is disposed on one of the lift pins 132 for measuring the force required to remove the wafer 108. The sensor 176 measures the change in capacitance between the wafer 108 and the electrostatic chuck 164.

The computer 106 is a general purpose, programmable computer system containing a central processing unit (CPU) 114 connected to conventional support circuits 116 such as a power supply, cache, memory, timing circuits, and the like. In addition, the CPU is connected to memory circuits 118 such as read-only memory (ROM) and random access memory (RAM). Furthermore, the RAM temporarily stores such values as a chucking voltage, a chucking period and a residual attraction force metric that are used during wafer processing. The present invention is implemented as a software program stored in memory 118 as a dechucking routine 122. Upon execution of this dechucking routine 122, the computer system becomes an apparatus for controlling the DC power supply to dechuck the workpiece in accordance with the operational steps of the dechucking routine 122 further detailed below.

Figure 2:
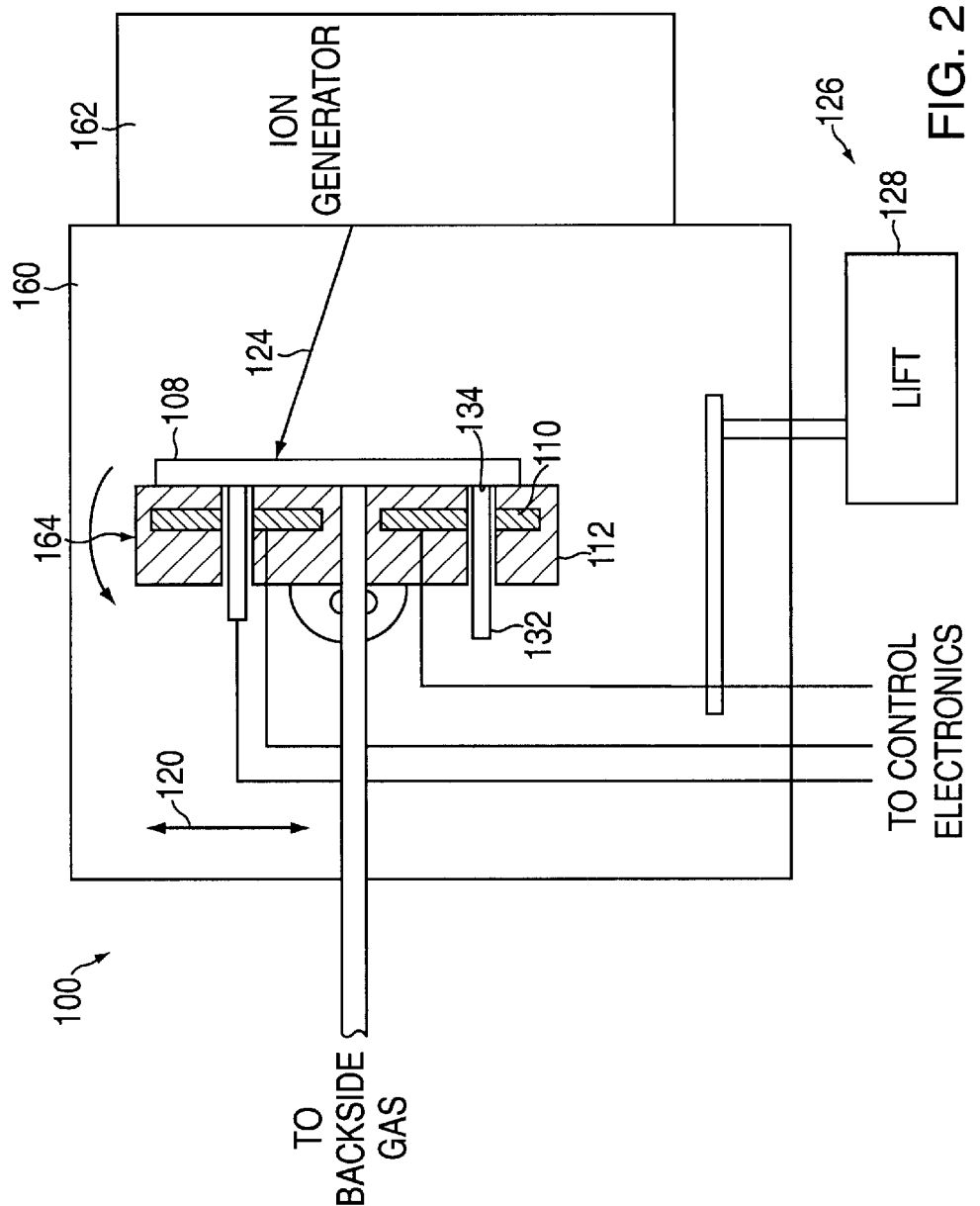
FIG. 2 is a sectional view, partially in schematic form, of the semiconductor wafer process system of FIG. 1 depicting the electrostatic chuck rotated to a vertical position; and, FIG. 3 depicts a flow diagram of the method of the present invention.

Once a chucking voltage is applied by the power source 104 to the electrodes 110, charges migrate from the electrodes 110 to the support surface 134 of the dielectric 112 and opposite charges are induced on the backside of the wafer 108 such that the wafer is held, i.e., chucked by the generated electrostatic attraction force. The attraction force is sufficient to permit the electrostatic chuck 164 to be rotated from a horizontal position to a vertical position without the wafer 108 moving across the support surface 134 of the electrostatic chuck 164. While in the vertical position depicted in FIG. 2, the electrostatic chuck 164 is moved in the vertical plane (as indicated by arrow 122). An ion beam 124 or other source of ions for implantation generated by the ion generator 162 is scanned horizontally while the wafer 108 is being displaced vertically such that all locations on the wafer 108 may be exposed to the ion beam 124.

Figure 3:
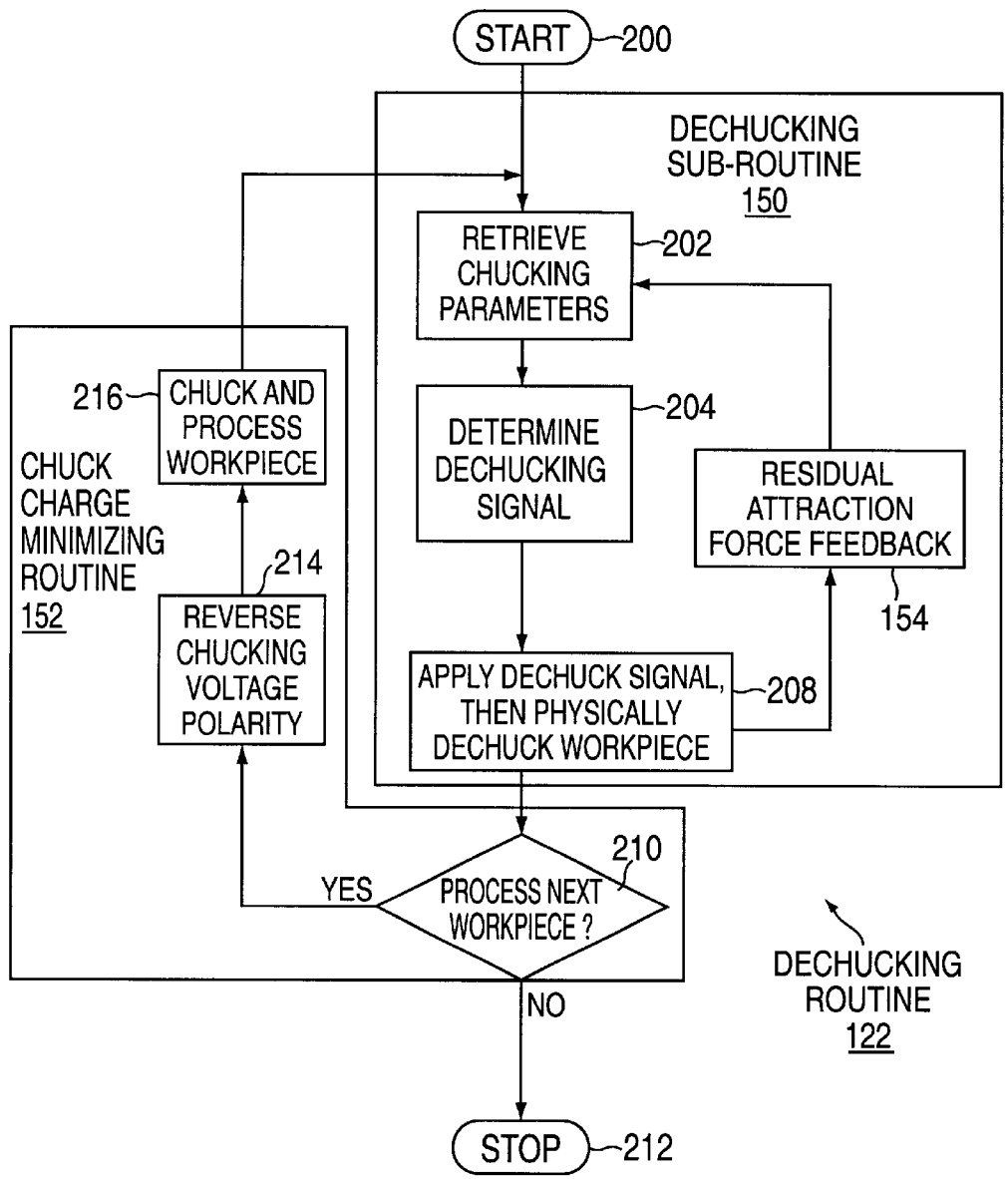

FIG. 3 depicts a flow diagram of an illustrative dechucking routine 122. For the best understanding of the dechucking routine 112, the reader is encouraged to refer simultaneously to the apparatus depicted in FIG. 1 and the flow diagram of FIG. 3.

The dechucking routine 122 comprises generally a dechucking subroutine step 150, a residual attraction force feedback step 154, and optionally includes a charge minimization step 152. The dechucking routine 122 begins at step 200 and proceeds to the dechucking subroutine 150. The dechucking subroutine 150 generally consists of an algorithm for determining a dechucking signal wherein the algorithm factors the residual force metric obtained through historical or actual measurements of the residual force metric taken during dechucking. As such, a number of conventional algorithms can be modified to use the residual force metric to obtain a precise dechucking signal. The increase precision of the dechucking signal results in a faster removal of the workpiece while minimizing the likelihood of workpiece damage. A number of methods are available that provide a method for dechucking wafer which can be executed by step 150, an example of which is the commonly assigned U.S. Pat. No. 5,818,682, issued Oct. 6, 1998, to David Loo, and is hereby incorporated by reference in it's entirety. Other methods for determining and applying a dechucking force may also be effectively utilized.

The illustrative subroutine 150 begins with step 202. At step 202, the chucking voltage, chucking period and residual chucking force metric are retrieved from registers within the computer system. For the first wafer, the residual chucking force metric is typically initialized as zero. Alternately, the residual chucking force metric may be retrieved from memory 118 at a predetermined or historical value. The chucking voltage and chucking period are entered into the registers as a predetermined value. At step 204, the routine computes the dechucking signal.

An illustrative algorithm for the dechucking signal is provided as:

$$T_{PW} = T_{NOM} + K_P(F_{DC} - F_{NOM})$$

where:

$T_{PW}$ is the period of the dechucking signal for the current workpiece;

$T_{NOM}$ is the period of the expected dechucking signal. $T_{NOM}$ is generally a function of the dechucking voltage (although the dechucking voltage may be varied, in the illustrative example, it is held at a predetermined level);

$K_P$ is a constant that is empirically determined;

$F_{NOM}$ is the expected residual force required to remove the current wafer; and $F_{DC}$ is the measured residual force metric required to remove the preceding wafer (or other historical removal force metric).

The reader should note that other algorithms may be readily formulated to provide a dechucking signal utilizing the residual force metric as taught herein. As such, the algorithm presented above is but one dechucking method that utilizes dechucking information from previous dechuckings.

The dechucking voltage is typically −1.5 times the chucking voltage for a workpiece such as an oxide wafer. However, the dechucking voltage may be computed by any one of a number of available dechucking voltage optimization methods that are available in the art. One such method is described in commonly assigned U.S. Pat. No. 5,459,632 Oct. 17, 1995 to Birang, et al, and is hereby incorporated by reference in its entirety.

Once the dechucking signal has been computed, the routine 150 proceeds to step 208. At step 208, the computer system sends the control signal (i.e., the dechucking signal) to the DC voltage supply to apply the dechucking voltage for a period equal to the dechucking period. At this point, the dechucking process is complete and the workpiece may be physically removed from the electrostatic chuck.

During step 154, the residual attraction force metric is obtained during the physically removal of the workpiece in step 208, and fed back to the computer system register for retrieval during step 202. The residual attraction force metric may be obtained through various methods known in the art, including mechanical force measurements, changes in capacitance between the wafer and the electrostatic chuck, and changes in the flow conditions of backside gases between the wafer and the electrostatic chuck. For example, the method described in commonly assigned U.S. Pat. No. 5,684,669, issued Nov. 4, 1997, to Collins et al., teaches that the residual attraction force metric may be obtained using a lift pin fitted with a force gauge or monitoring changes in the backside gas flow conditions. As such, any drift in residual attraction force metric caused, for example, by charge accumulation on the electrostatic chuck surface, can be detected during the dechucking of a first workpiece and used to more accurately calculate the dechucking parameters used to dechuck a subsequent workpiece. For example, if an increase in the residual force is found, then a commensurate change in the dechucking signal (i.e., an increase in the dechucking voltage and/or dechucking signal) is used to dechuck the next wafer. Thus, such changes in residual attracting resulting in changed dechucking requirements are compensated for during the determination of the dechucking voltage and period in steps 204 and 208, respectively, for next wafer to be processed.

To minimize the potential charge accumulation upon the electrostatic chuck, the charge minimization routine of step 152 should be applied after each wafer is processed. Thus, at step 210, the routine queries whether another workpiece is to be processed. If the query is negatively answered, the routine proceeds to step 212 that ends the dechucking routine 122. However, if the query is affirmatively answered, the routine proceeds to step 214.

To further improve the dechucking process the chucking voltage should be reversed in polarity after each wafer is processed. Reversing polarity assists the dielectric material of the chuck from becoming polarized and correspondingly, making dechucking progressively more difficult. Therefore, at step 214, the polarity of chucking voltage is reversed and, at step 216, the next workpiece is processed. By reversing the polarity, the residual attraction force is maintained in a limit cycle wherein the amplitude of the attraction force remains at lower levels than if the chuck only experienced dechucking voltages of the same polarity. This is due in part to the residual attraction force not being repeatedly subjected voltages of the same polarity that result in an accumulating charge. To dechuck the next workpiece, the routine returns to the dechucking subroutine 122 at step 202. In one embodiment, the use of described method permits the subsequent workpieces to be dechucked in less than about 200 milliseconds.

The embodiment of the invention illustratively described above discloses a chucking signal comprising both a dechucking voltage and a dechucking period. Alternately, dechucking signals may comprise solely a dechucking voltage. Although a single embodiment incorporating the teachings of the present invention has been shown and described in detail, those skilled in the art can readily devise many other varied embodiments that still incorporate these teachings.

What is claimed is:

1. Apparatus for dechucking a wafer comprising:
   an electrostatic chuck having at least one embedded electrode;
   a controller;
   a power supply coupled to said controller and said at least one embedded electrode, said power supply for providing a dechucking signal to said electrostatic chuck; and,
   a memory communicating with said controller, said memory for storing and providing a residual force metric used by said controller for calculating said dechucking signal.

2. The apparatus of claim 1 further comprising:
   a force gauge coupled to said controller for measuring said residual force metric.

3. The apparatus of claim 1, wherein said residual force metric is determined by monitoring changes in flow conditions of a backside gas disposed between said electrostatic chuck and said wafer.

4. The apparatus of claim 1, wherein said residual force metric is determined by monitoring changes in capacitance between said electrostatic chuck and said wafer.

5. In a system that successively retains a plurality of workpieces, a method of dechucking each of said workpieces from an electrostatic chuck comprising the steps of:
   determining a first dechucking signal using a stored first residual attraction force metric;
   applying said dechucking signal to said electrostatic chuck; and,
   removing a first of said workpieces while measuring a second residual attraction force metric.

6. The method of claim 5, wherein the step of determining said first dechucking signal further comprises the step of: determining a dechucking period.

7. The method of claim 5, wherein the step of determining said first dechucking signal further comprises the step of:
   storing said second residual attraction force metric, and
   determining a second dechucking signal using said second residual attraction force metric; and,
   dechucking a second of said workpieces.

8. The method of claim 5, wherein the step of removing said first of said workpieces further comprises the neutralizing of said residual attraction force.

9. The method of claim 8, wherein said neutralizing of said residual attraction force occurs in less than about 200 milliseconds.

10. The method of claim 5 further comprising the step of minimizing a residual charge build up upon said electrostatic chuck.

11. The method of claim 10, wherein said step of minimizing said residual charge build up further comprises the step of reversing the polarity of a chucking voltage to a second of said workpieces, wherein said second workpiece is processed subsequent to said first workpiece.

12. In a system that successively retains a plurality of workpieces, a method of dechucking each of said workpieces from an electrostatic chuck comprising the steps of:
   determining a first dechucking signal;
   applying said dechucking signal to said electrostatic chuck;
   removing a first of said workpieces;
   measuring an actual residual attraction force metric; and,
   providing said measured residual attraction force metric for using in determining a second dechucking signal.

13. The method of claim 12, wherein the step of determining said first dechucking signal further comprises the step of:

determining a dechucking period.

14. The method of claim 13 further comprising the step of minimizing a residual charge build up upon said electrostatic chuck by reversing the polarity of a chucking voltage to a second of said workpieces, wherein said second workpiece is processed subsequent to said first workpiece.

15. The method of claim 12, wherein the step of determining said first dechucking signal further comprises the step of:

retrieving a stored residual attraction force metric.

16. A computer readable medium containing a software routine that, when execute by a processor coupled to a system that successively retains a plurality of workpieces upon an electrostatic chuck, cause the processor to perform the steps of:

determining a first dechucking signal;

applying said dechucking signal to said electrostatic chuck;

removing a first of said workpieces;

measuring an actual residual attraction force metric; and, providing said measured residual attraction force metric for using in determining a second dechucking signal.

17. The method of claim 16, wherein the step of determining said first dechucking signal further comprises the step of:

determining a dechucking period.

18. The method of claim 16, wherein the step of determining said first dechucking signal further comprises the step of:

retrieving a stored residual attraction force metric.

19. The method of claim 16, wherein the step of removing said first of said workpieces further comprises the neutralizing of said residual attraction force.

20. The method of claim 19, wherein said neutralizing of said residual attraction force occurs in less than about 200 milliseconds.

21. The method of claim 16, further comprising the step of minimizing a residual charge build up upon said electrostatic chuck.

22. The method of claim 21, wherein said step of minimizing said residual charge build up further comprises the step of reversing the polarity of a chucking voltage to a second of said workpieces, wherein said second workpiece is processed subsequent to said first workpiece.

23. An ion implant system comprising:

a vacuum chamber;

an ion beam generator coupled to said vacuum chamber;

an electrostatic chuck positioned within said vacuum chamber and having at least one electrode a controller;

a power supply coupled to said controller and said at least one embedded electrode, said power supply for providing a dechucking signal to said electrostatic chuck; and, a memory communicating with said controller, said memory for storing and providing a residual force metric used by said controller for calculating said dechucking signal.

24. The ion implant system of claim 23 further comprising:

a force gauge coupled to said controller for measuring said residual force metric.

25. The ion implant system of claim 23 further comprising a sensor for determining said residual force metric by monitoring changes in flow conditions of a backside gas disposed between said electrostatic chuck and said wafer.

26. The apparatus of claim 23 further comprising a sensor for determining said residual force metric by monitoring changes in capacitance between said electrostatic chuck and said wafer.

* * * * *

UNITED STATES PATENT AND TRADEMARK OFFICE
CERTIFICATE OF CORRECTION

PATENT NO. : 6,307,728 B1
DATED : October 23, 2001
INVENTOR(S) : Leeser

It is certified that error appears in the above-identified patent and that said Letters Patent is hereby corrected as shown below:

<u>Title page,</u>
Please change the date of U.S. PATENT DOCUMENT 5,818,682 from "9/1998" to -- 10/1998. --.

Signed and Sealed this

Ninth Day of April, 2002

Attest:

JAMES E. ROGAN
Director of the United States Patent and Trademark Office

Attesting Officer